United States Patent
Wagner

(10) Patent No.: US 7,567,644 B2
(45) Date of Patent: Jul. 28, 2009

(54) PHASE-LOCK LOOP, METHOD FOR FREQUENCY SWITCHING IN A PHASE-LOCK LOOP, AND USE OF SAID PHASE-LOCK LOOP

(75) Inventor: Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 343 days.

(21) Appl. No.: 11/514,521

(22) Filed: Sep. 1, 2006

(65) Prior Publication Data

US 2007/0060090 A1 Mar. 15, 2007

Related U.S. Application Data

(63) Continuation of application No. PCT/DE2005/000361, filed on Mar. 3, 2005.

(30) Foreign Application Priority Data

Mar. 3, 2004 (DE) .................. 10 2004 010 365

(51) Int. Cl.
*H03D 3/24* (2006.01)
*H04L 7/00* (2006.01)
(52) U.S. Cl. ...................... 375/376; 327/156
(58) Field of Classification Search ............... 375/327, 375/373, 376; 327/147, 156
See application file for complete search history.

(56) References Cited

U.S. PATENT DOCUMENTS 4,612,516 A 9/1986 Defeuilley et al.

6,417,738 B1 7/2002 Lautzenhiser
6,515,553 B1 * 2/2003 Filiol et al. ................. 332/127

(Continued)

FOREIGN PATENT DOCUMENTS

EP 0 360 442 A1 3/1990
EP 0 729 230 B1 8/1996

OTHER PUBLICATIONS

"A 1-V 5.2-GHz 27.5-mW Fully-Integrated CMOS WLAN Synthesizer", Gerry C.T. Leung and Howard C. Luong, Conference on European Solid-Stage Circuits, ESSCIRC, Sep. 2003, 5 pgs.

(Continued)

*Primary Examiner*—Young T. Tse
(74) *Attorney, Agent, or Firm*—Eschweiler & Associates, LLC

(57) ABSTRACT

The invention relates to a phase comparison circuit including a reference input and a feedback input, and an output provided with a controlled oscillator which is connected thereto. A frequency divider with an adjustable division ratio resides in the feedback path of the phase-lock loop. The phase-lock loop includes a frequency adjusting arrangement having a first and a second control input, a first output which is connected to the frequency divider and is used to generate a digital regulating signal, and a second output which is coupled to the controlled oscillator and is used to generate an analog control signal. The first control input is embodied in such a way as to adjust a frequency of the phase-lock loop, and the second control input is embodied in such a way as to switch the frequency of the phase-lock loop according to a frequency offset. The phase-lock loop can advantageously be used to compensate frequency offsets of received signals.

14 Claims, 3 Drawing Sheets

U.S. PATENT DOCUMENTS

| | | | |
|---|---|---|---|
| 6,933,798 B2 * | 8/2005 | Hammes et al. | 332/127 |
| 2003/0043950 A1 | 3/2003 | Hansen et al. | |
| 2003/0139147 A1 | 7/2003 | Shi | |
| 2003/0176173 A1 * | 9/2003 | Klemmer | 455/182.2 |

OTHER PUBLICATIONS

"Direct-Conversion CMOS Transceiver with Automatic Frequency Contorl for 802.11a Wireless LANs", A. Behzad, L. Lin, Z.M. Shi, S. Anand, K. Carter, M. Kappes, E. Lin, T. Nguyen, D. Yuan, S. Wu, Y.C. Wong, V. Fong and A. Rofougaran, IEEE International Solid-State Circuits Conference, ISSCC 2003/Session 20/Wireless Local Area Networking/Paper 20.4, 11 pgs.

"A Direct-Conversion CMOS Transceiver with Automatic Frequency Control for IEEE 802.11a Wireless Lan", A. Behzad, L. Lin, Z.M. Shi, S. Anand, K. Carter, M. Kappes, E. Lin, T. Nguyen, D. Yuan, S. Wu, Y.C. Wong, V. Fong and A. Rofougaran, Script of Talk held at 2003 IEEE Solid-State Circuits Conference, 30 pgs.

* cited by examiner

PHASE-LOCK LOOP, METHOD FOR FREQUENCY SWITCHING IN A PHASE-LOCK LOOP, AND USE OF SAID PHASE-LOCK LOOP

REFERENCE TO RELATED APPLICATIONS

This application is a continuation of PCT/DE2005/000361filed Mar. 3, 2005 which was not published in English, that claims the benefit of the priority date of German Patent Application No. DE 10 2004 010 365.8, filed on Mar. 3, 2004, the contents of which both are herein incorporated by reference in their entireties.

FIELD OF THE INVENTION

The invention relates to a phase-lock loop for fast frequency switching and a method for fast frequency switching in a phase-lock loop. The invention further relates to a use of a phase-lock loop.

BACKGROUND OF THE INVENTION

Phase-lock loops are used particularly in receivers to generate an oscillator signal with which a received signal is converted to an intermediate frequency. This mixing process is known as an intermediate frequency conversion. An intermediate frequency conversion to a particular intermediate frequency of 0 is especially advantageous, since a signal thus converted can be further processed especially easily. An example of a possible problem in a frequency conversion can be explained based on a conversion of OFDM signals (orthogonal frequency division multiplex signals). OFDM signals are pulsed signals, and comprise several individual subcarriers of different frequencies. Each subcarrier transmits one symbol per pulse, which is given by the amplitude and the phase position of the subcarrier during the pulse. The totality of all subcarriers per pulse is called the OFDM symbol.

The individual subcarriers are distinguished by the fact that the cross correlation between any two subcarriers ideally results in a value of 0. In other words, in the frequency space, a zero crossing of a subcarrier is always within the maximum of an adjacent carrier. The frequencies of the individual subcarriers differ by n times a difference frequency.

For receivers that receive OFDM signals, there is the problem of a DC signal component in the signal path of the receivers, which is called the DC offset. This is important primarily in the case of a slight frequency offset of the received signal with respect to the ideal receiving frequency. With the conversion in the receiver, the DC signal component is converted to the center frequency normally not used by OFDM signals. The later signal processing can compensate for this, however. In case of an additional frequency offset in the received OFDM signal, all subcarriers of the OFDM signal shift by the value of the frequency offset. This can cause a subcarrier of the OFDM signal to overlap with the DC signal component. The overlap can no longer be compensated for by the subsequent signal processing and is expressed in an erroneous demodulation of the subcarrier overlapped by the DC signal component.

The problem of a DC signal component with simultaneous frequency offset of the carrier can be easily corrected with OFDM receivers that convert to an intermediate frequency that is not equal to 0. On the other hand a frequency conversion to the intermediate frequency 0 is desirable, particularly for send mode and for various modulation types, since such building elements can be used for both sending and receiving mode.

OFDM transceivers in which the sending and receiving unit are implemented together thus use switching for the intermediate frequency generation to solve the above problem of a shifted DC signal component. The sending operation and the receiving operation thus use different local oscillator signals so that in the receiving operation the intermediate frequency is no longer 0 but at least half the signal bandwidth. A DC signal component in the receiver path then no longer falls within the useful signal band.

Since such switching must take place within microseconds, it is hardly possible to switch a normal phase-lock loop as a local oscillator using corresponding control. Rather, an additional mixer is used, which converts the local oscillator signal with an auxiliary signal of a suitable frequency and thus generates the desired frequency-shifted signal. A mixer generates interference signals, however, such as harmonics of the intermediate frequency or image signals. Due to this, the problem of undesirable signal portions on the intermediate frequency remains.

Another solution to compensate for a DC signal component in the case of a frequency offset of an OFDM signal meeting WLAN standard 802.11a can be found in a publication by A. Behzad et. al. Entitled "20.4 Direct conversion CMOS Transceiver with Automatic Frequency control for 802.11a Wireless LANs", ISSCC 2003, Session 20, Paper 20.4. The method described there is very cumbersome, however.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a phase-lock loop, which enables very fast frequency switching without a prolonged settling of the phase-lock loop. The invention also comprises a method for fast frequency switching in a phase-lock loop.

According to one embodiment the invention, a phase-lock loop comprises a phase comparison circuit with a reference frequency input, a feedback input and an output. The phase comparison circuit is connected to a controlled oscillator. A frequency divider with an adjustable division ratio in a feedback path of the phase-lock loop is connected via its signal input to an output of the controlled oscillator and via a signal output to the feedback input of the phase comparison circuit. The phase-lock loop further comprises a frequency adjustment arrangement with a first control input to adjust a frequency of the oscillator, a second control input for a signal to shift the frequency of the oscillator and with a first output to provide a digital control signal and a second output to provide an analog control signal. The first output is connected to the frequency divider, while the second output is coupled to the controlled oscillator.

The first control input advantageously serves to adjust the frequency of the phase-lock loop by adjusting the division ratio, while the second control input is used only for signals to shift the frequency and thus for a frequency offset. The signal for frequency shifting in one embodiment is fed to the digital frequency divider on the one hand and on the other hand applied directly to the controlled oscillator for a frequency shift. Because of this, the controlled oscillator generates an output signal with the shifted frequency very quickly while the phase-lock loop gains time for its regulating adjustment. If the controlled oscillator continues to exhibit a slight deviation from the desired frequency adjusted at the first and second control input by applying the second control signal, this is corrected by the phase-lock loop. The desired frequency is nevertheless achieved faster due to the application of the second control signal.

The output signal of the phase-lock loop, now frequency-shifted by a specific amount, can in one example be used as a local oscillator signal in case of frequency conversion to compensate for a frequency offset of a signal to be switched and thus to correct the frequency offset in the received signal. A DC signal component occurring in a receiver path can thus be easily detected and corrected.

In another embodiment, a method for frequency adjustment with frequency offset in a phase-lock loop comprises generating a phase-lock loop and applying a first control signal to an adjustable frequency divider of the phase-lock loop for nominal frequency adjustment of an output signal of the phase-lock loop. The method further comprises applying a second control signal to a controlled oscillator of the phase-lock loop to adjust a frequency offset of the output signal of the phase-lock loop.

It is useful in one embodiment if the first control signal is generated from a channel adjustment signal and the second control signal before application. The channel adjustment signal in one example corresponds to the nominally desired output frequency of the phase-lock loop without frequency offset.

With the method according to the invention, the output frequency of a phase-lock loop can thus very quickly be shifted by a value determined by the second control signal. The actual phase-lock loop, with its phase detector and its frequency divider in the feedback path of the lock loop, thus gains additional time to regulate and to adjust precisely to the desired frequency.

In one embodiment, for use in WLAN receivers (wireless local area network receivers) which use OFDM signals for data transmission, it is advantageous to perform a frequency shift in the local oscillator signal at high speed and to thereby ensure a conversion to the intermediate frequency 0 without errors.

An advantageous further embodiment of the method is provided where the second control signal applied to the controlled oscillator is sent through a digital-analog converter with a readjusted transmission factor. This is advantageous if a drift still exists between the adjusted frequency in the frequency divider of the phase-lock loop and the second control signal. This drift can be compensated for through the additional re-adjustable transmission factor.

It is thus practical in this example if the frequency adjustment arrangement comprises a digital-analog converter, whose output is connected to the second input of the controlled oscillator and whose input is connected to the second control input. In an advantageous further embodiment of the invention, the digital-analog converter exhibits a readjustment input to change an amplitude of the analog control signal. This makes it possible to readjust an inexact control. Alternatively, a digital-analog converter with a series-connected digital multiplier can also be used.

In another further embodiment of the invention, the frequency adjustment arrangement comprises a sigma-delta modulator, whose input is coupled with the first and second control input and whose output is coupled with the adjustable frequency divider. The output signal of the sigma-delta modulator thus makes up the fraction of the divider value for the frequency divider.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is described in detail below based on an exemplary embodiment with the aid of drawings. Shown are.

DETAILED DESCRIPTION OF THE INVENTION

Figure 1:
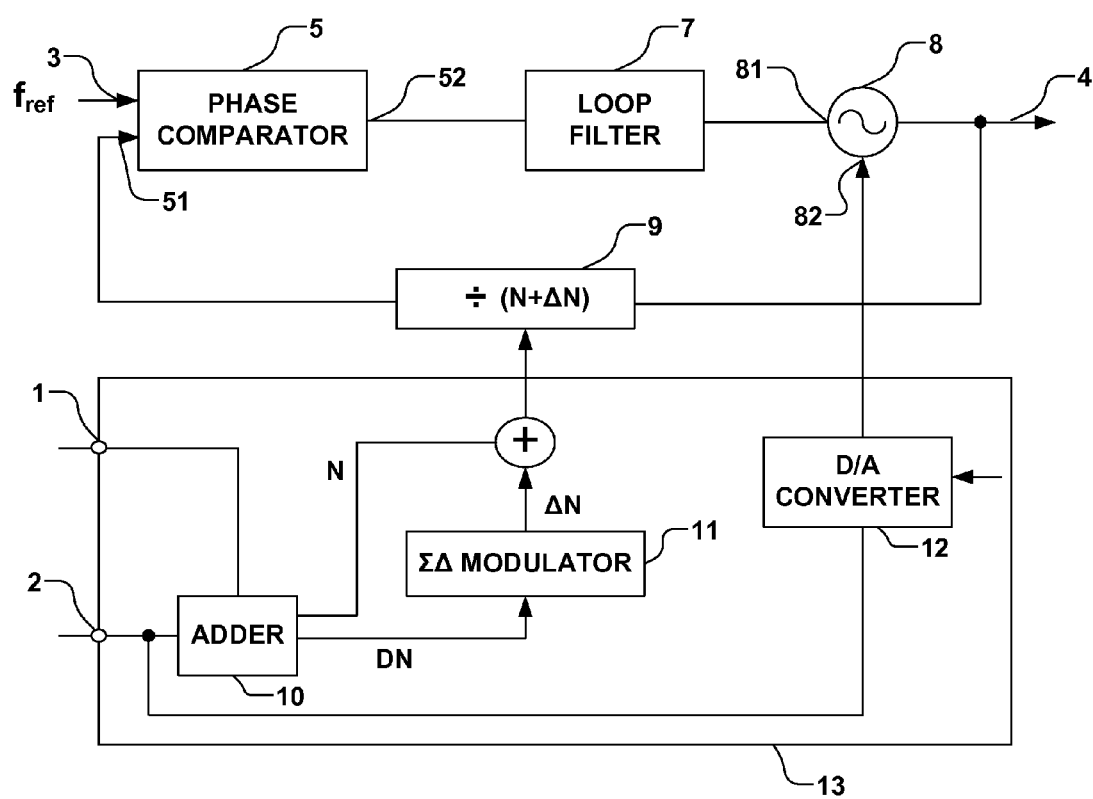
FIG. 1 is a block diagram illustrating exemplary embodiment of the invention.

FIG. 1 shows a phase-lock loop according to the invention with a first control input 1, a second control input 2, a reference input 3 and a signal output 4. The reference input 3 is configured to receive a reference signal with frequency $f_{ref}$ to a phase comparator 5 whose second input is connected to a feedback path. An output 52 of the phase comparator 5 is connected via a loop filter 7 to a first control input 81 of a voltage-controlled oscillator 8 to adjust its output frequency.

The phase comparator 5 compares the phase of the signals at the feedback input 51 and at the input 3 and generates a regulating signal from this, which will be issued at the output 52. The regulating signal is filtered through the loop filter 7 and fed to the control input 81 to adjust the frequency of output signal of the voltage-controlled oscillator 8.

The output of the voltage-controlled oscillator 8 makes up the output 4 of the phase-lock loop according to the invention and is also connected via the frequency divider 9 in the feedback path of the phase-lock loop with the input 51 of the phase detector 5. The division ratio of the frequency divider 9 can be adjusted to a regulating input by means of a divider control signal.

The output signal at output 4 of the phase-lock loop is kept stable by the regulating signal of the phase detector 5. Deviations or fluctuations, the so-called phase jitters of the oscillator, are settled in that the phase detector 5 calculates the deviation, issues the corresponding regulating signal at the output and feeds this via the loop filter 7 to the control input of the oscillator. In order to achieve another output frequency of the voltage-controlled oscillator and thus the phase-lock loop, a regulating signal for a frequency divider must be adjusted with another division ratio.

Digital control signals are provided at the inputs 1 and 2. The control inputs 1 and 2 lead to an adder. The adder 10 adds the digital signals available at the inputs 1 and 2. The digital output signal corresponds to the division ratio and contains a whole-number component N as well as a fractional component DN. Take a division ratio of 3.521 as an example. In that case, the whole-number component N=3, while the fraction DN=521. The division ratio is calculated from the two control signals and can consist of just a whole number, a fraction only or a combination of the two.

The adder 10 feeds the whole-number component N via another adder directly to the control input of the frequency divider 9. The first adder 10 is also connected to a sigma-delta modulator 11. Through this connection, the adder 10 feeds the fractional component DN to the sigma-delta modulator 11, which is configured to generate averages and from this generates the fractional component ΔN suitable for the frequency divider. The output of the sigma-delta modulator 11 is likewise connected via the second adder to the control input of the frequency divider 9. Any average division ratio can thus be adjusted at the frequency divider 9 via the whole-number component N and the fractional component ΔN. It must be noted that the division ratio and the control signals at the inputs 1 and 2 are dependent on the frequency of the reference signal applied to the reference input. If this frequency is adjusted to a fixed 10 MHz, for example, then, for a desired output frequency of 25 MHz, the division ratio must equal to 2.5.

The control input 2 is additionally connected to a digital-analog converter 12, which converts the signal available at the control input 2 into an analog signal and feeds this to a second regulating input 82 of the voltage-controlled oscillator 8 to adjust its output frequency. With the second control signal at the control input 2, the voltage-controlled oscillator is thus directly controlled and its frequency changed. In the exemplary embodiment, the voltage-controlled oscillator contains two regulating inputs 81 and 82. It is possible, however, to combine the two regulating inputs into one and to feed the regulating signal of the phase comparator 5 and the analog signal through an adder to the regulating input.

The digital-analog converter 12 is additionally designed for a variable gain at the output side of readable signals. In addition, it has a control input, at which a signal can be fed to adjust its gain. An amplitude of the analog output signal of the converter 12 can thus be adjusted depending on the fed control signal.

In a normal operating mode, the phase-lock loop according to the invention is fed a signal for its nominal frequency adjustment of the output signal via the control input 1. In the case of a use in an OFDM receiver, this is for example a control signal for the sender frequency of the channel to be used. The adder 10 generates from this a rational division ratio with a whole number value N and a fractional value DN, which is converted via the sigma-delta modulator 11 into the fractional component ΔN. The two signal components are fed as the division ratio to the frequency divider 9. After a lock-in of the phase-lock loop, the voltage-controlled oscillator 8 generates a signal at the output with the frequency adjusted by that at the control input 1. For the compensation of a frequency offset in the OFDM receiver path, the phase-lock loop according to the invention must change its output frequency as fast as possible.

A readjustment of the phase-lock loop by a change in the division ratio at the frequency divider 9 is, however, not fast enough for this. For this reason, the frequency offset to be adjusted is fed using the control signal to the control input 2 and to the adder 10 as well as the digital-analog converter 12. This converts the signal into an analog control signal and applies it directly to the second control input 82 of the voltage-controlled oscillator 8. The output frequency of the oscillator changes according to the available control signal. At the same time, the adder 10 generates a new rational division ratio from the channel adjustment signal now available at the control input 1 and the frequency offset signal at the control input 2. The division ratios N and ΔN generated by the adder 10 and the one generated with a sigma-delta modulator 11 are added and fed to the frequency divider 9 as the new frequency division ratio.

By means of the analog control signal at the second control input of the voltage-controlled oscillator 8, the latter already generates a new output signal, which is fed in the feedback path to the frequency divider 9. This now divides it according to the new division ratio and feeds it in turn to the phase detector for comparison with the reference signal. If the output frequency of the new output signal adjusted by the analog control signal is the desired frequency, then the phase detector 5 generates no further regulating signal with the newly adjusted frequency division ratio. The phase-lock loop is locked in at the new frequency.

If there is a deviation between the output signal at the output 4 and the signal adjusted by the new division ratio, then the phase detector 5 generates a control signal. The phase-lock loop regulates towards the signal adjusted by the frequency divider 9. This results in a slight drift after applying the analog control signal. This drift is measured using appropriate means. An additional control signal is generated from this and fed to the digital-analog converter 12 as a gain factor to compensate for the incorrect offset adjustment.

Figure 2:
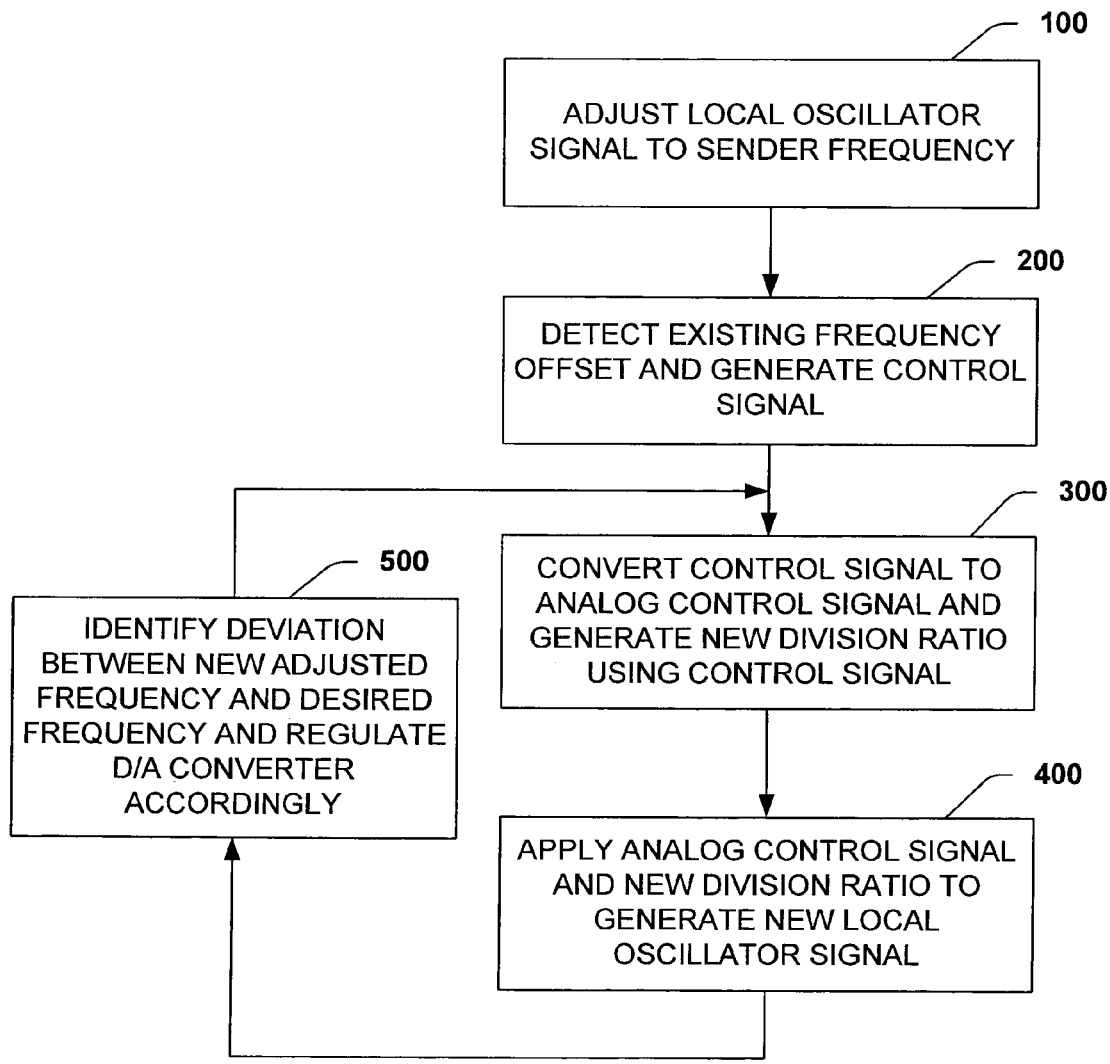
FIG. 2 is a flow chart illustrating an exemplary embodiment of a method according to the invention.

FIG. 2 shows an exemplary embodiment of the method according to the invention as it is used, for example, in WLAN-OFDM receivers with an intermediate frequency conversion to the intermediate frequency 0. The phase-lock loop according to the invention is used here as a local oscillator to generate a local oscillator signal for the frequency conversion to the intermediate frequency 0.

In a first step 100, the local oscillator signal, which is given by the signal at the output 4, is adjusted to a sender frequency using a channel adjustment signal, which indicates a specific division ratio. The sender frequency of the frequency channel results here from the standard. A conversion of a received OFDM signal is thus initially accomplished with this local oscillator signal. The converted signal is prepared, digitalized and fed to further signal processing circuits.

The W-LAN Standard 802.11a further specifies that OFDM receivers, upon receiving a signal, detect a frequency offset between the frequency specified by the standard and adjusted by the channel adjustment signal and the frequency of the received signal. Such a frequency offset can be caused by various external effects, such as the Doppler effect, but also by an offset in the sending frequency of the sender.

A detection and correction of the offset occurs at the beginning of a signal burst of an 802.11a data package, for which the standard specifies a maximum of 16 μs. An existing frequency offset is detected in step 200 and from this, a frequency offset for compensation is calculated. This offset is fed as a control signal. A new division ratio results from the channel adjusting signal and the control signal.

At step 300, the control signal is applied to a digital-analog converter, which generates from it an analog control signal for frequency adjustment of a voltage-controlled oscillator of the phase-lock loop. At the same time, an adder generates a new division ratio from the channel adjusting signal and the control signal, which represents the frequency offset. The new division ratio is used to adjust the phase-lock loop and fed to a frequency divider in a reverse path. In step 400, the simultaneous application of the analog control signal and a new division ratio generates a new local oscillator signal, which is shifted by the measured frequency offset. The deviation between the now adjusted frequency and the desired frequency, which is specified by the division ratio, is calculated. At step 500, a control signal is generated from this to compensate for this deviation and is connected to a regulating input of the digital-analog converter.

The speed of the adjustment of the phase-lock loop to the new frequency by the direct application of the control signal representing a frequency offset is so high here that the frequency offset can be compensated for in the received signal before the beginning of a useful signal. Data losses in the later useful signal with the conversion to the intermediate frequency 0 can thus be prevented.

A frequency offset in the received signal is compensated for by the frequency shift of the local oscillator signal. A DC current component in the receiver path can thus be suppressed without problems using a fast Fourier transformation. In addition to the use in OFDM receivers, the phase-lock loop according to the invention can be used for local oscillators, with which the frequency switching of the output signal should be accomplished as quickly as possible. A frequency offset in the output signal can be achieved especially fast by the direct feed of the second control signal to the oscillator.

Figure 3:
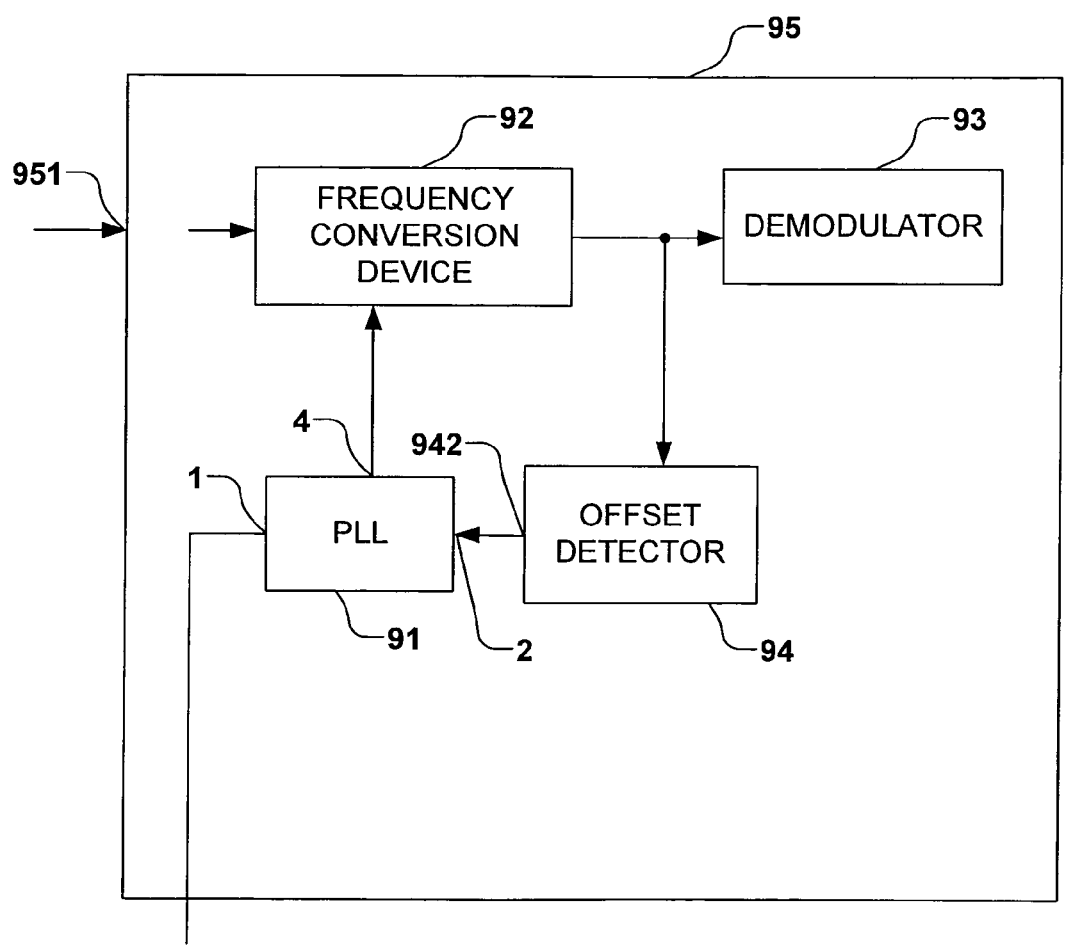
FIG. 3 is a block diagram illustrating an exemplary embodiment of an application in a receiver path.

FIG. 3 shows a section of the receiver path of an OFDM receiver with the phase-lock loop according to one embodiment of the invention. The receiving path 95 comprises a device 94 for detecting a frequency offset, which is connected with a regulating output 942 with the second control input 2 of the phase-lock loop 91 according to the invention. A signal applied to the input 951 of the receiving path is converted to the intermediate frequency 0 in a conversion device 92. For this, the conversion device 92 uses a local oscillator signal, which was generated by the phase-lock loop 91 according to the invention at its output 4. The frequency of the local oscillator signal results from the channel adjustment signal at input 1. If the signal converted to the intermediate frequency 0 exhibits a frequency offset, this is detected in a detection device 94. This is connected at its input to the output of the conversion device 92. The detection device 94 generates a control signal from the frequency offset. This is fed to the conversion device 92 at the second control input.

The phase-lock loop according to the invention adjusts the new frequency very fast and thus compensates for the frequency offset that thus occurs. The received signal is now converted using the frequency-shifted local oscillator signal such that a DC signal component occurring in a receiver path lies at the unused center frequency 0. The converted signal can then be further processed in the demodulation device 93, also connected with the output of the conversion device.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A phase-lock loop for fast frequency switching, comprising:
    a phase comparison circuit comprising a reference input, a feedback input and an output;
    a controlled oscillator having a first regulating input coupled to the output of the phase comparison circuit, and configured to adjust a frequency of an oscillator signal at an output thereof;
    a frequency divider coupled between the output of the controlled oscillator and the feedback input and configured to divide down the frequency of the oscillator signal according to an adjustable division ratio; and
    a frequency adjusting arrangement coupled to a regulating input of the frequency divider, and comprising a first control input configured to receive a digital frequency adjusting signal and a second control input configured to receive a digital frequency shifting signal, and wherein the frequency adjusting arrangement further comprises:
        a first adder having inputs connected to the first and second control inputs and configured to generate and output a whole-number component at a first output and a fractional component at a second output based on the signals at the first and second control inputs;
        a sigma-delta modulator comprising an input connected to the second output of the first adder;
        a second adder, comprising inputs connected to the first output of the first adder and to an output of the sigma-delta modulator and configured to prepare a regulating signal at the regulating input of the frequency divider to adjust the division ratio thereof; and
        a digital-analog converter configured to receive the signal at the second control input, convert it to an analog control signal, and provide the analog control signal to a second regulating input of the controlled oscillator.

2. The phase-lock loop of claim 1, wherein the digital-analog converter further comprises a readjusting input configured to receive a gain adjustment signal, and configured to change an amplitude of its analog output signal as a function of the gain adjustment signal.

3. The phase-lock loop of claim 2, further comprising a digital multiplier configured to change the amplitude of the analog output signal of the digital-analog converter by varying the signal at the second control input before the digital-analog converter.

4. The phase-lock loop of claim 1, wherein the first regulating input and the second regulating input are the same input.

5. A method for frequency switching in a phase-lock loop, comprising:
    generating a phase-lock loop signal;
    generating a first regulating signal from a first channel adjusting signal;
    applying a divider control signal to an adjustable frequency divider of the phase-lock loop to adjust a division ratio of the frequency divider;
    determining a control signal from a frequency offset of a signal whose frequency is converted using the phase-lock loop;
    generating a second regulating signal from a second channel adjusting signal and the control signal;
    applying the second regulating signal to the adjustable frequency divider to adjust the division ratio of the frequency divider;

generating an oscillator regulating signal to regulate an output frequency of a controlled oscillator based on a phase comparison of a reference signal with a feedback signal derived from the output signal of the controlled oscillator;

converting the control signal into an analog control signal;

applying the oscillator regulating signal to the controlled oscillator;

applying the analog control signal to the controlled oscillator of the phase-lock loop to switch the output frequency of the controlled oscillator by the frequency offset;

determining a deviation between an ideal frequency in the output frequency of the controlled oscillator after applying the analog control signal and an actual frequency in the output frequency of the controlled oscillator after applying the second regulating signal; and generating a readjusting signal and applying the readjusting signal to a component employed to convert the control signal into the analog control signal or to the controlled oscillator to compensate for the deviation.

6. The method of claim 5, wherein the deviation is determined by analyzing the output signal of the phase-lock loop.

7. The method of claim 5, wherein applying analog control signal comprises performing a digital-analog conversion with a transmission factor, the transmission factor changing an amplitude of the analog control signal.

8. A phase-lock loop, comprising:
a phase comparator configured to compare a reference signal to a feedback signal and generate a first regulating signal in response thereto;
an oscillator configured to generate an oscillator signal as a function of the first regulating signal;
a frequency divider circuit configured to divide down the oscillator signal and thereby generate the feedback signal based on a divider control signal;
a frequency adjustment circuit configured to generate the divider control signal and a second regulating signal based on a determined frequency offset, wherein the second regulating signal is input to the oscillator, and wherein the oscillator signal is also a function of the second regulating signal.

9. The phase-lock loop of claim 8, wherein the second regulating signal comprises an analog signal.

10. The phase-lock loop of claim 8, wherein the determined frequency offset is associated with a received signal that is down converted using the oscillator signal of the phase-lock loop.

11. The phase-lock loop of claim 8, wherein the frequency adjustment circuit comprises:
a first adder circuit configured to generate a whole number component and a fractional number component of a divider ratio based on first and second digital control signals, wherein the first digital control signal is based on a selected channel frequency, and the second digital control signal is based on the determined frequency offset.

12. The phase-lock loop of claim 11, wherein the frequency adjustment circuit further comprises:
a sigma-delta modulator configured to generate a fraction control signal based on the fractional number component; and
a second adder circuit configured to generate the divider control signal based on the whole number component and the fraction control signal.

13. The phase-lock loop of claim 11, wherein the frequency adjustment circuit further comprises a digital-to-analog converter configured to convert the second digital control signal into the second regulating signal in analog form, and directly input the second regulating signal to the oscillator.

14. The phase-lock loop of claim 13, wherein the digital-to-analog converter comprises a gain control input, and wherein the digital-to-analog converter is configured to vary a gain thereof based on a deviation of an actual change in frequency of the oscillator signal based on the determined frequency offset from an expected frequency change.

* * * * *